(12) United States Patent
Upadhyayula et al.

(10) Patent No.: US 8,637,779 B2
(45) Date of Patent: Jan. 28, 2014

(54) ELECTRONIC COMPONENT INCLUDING MICRO BALLS

(75) Inventors: Suresh Upadhyayula, San Jose, CA (US); Naveen Kini, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 151 days.

(21) Appl. No.: 13/151,145

(22) Filed: Jun. 1, 2011

(65) Prior Publication Data

US 2012/0305305 A1 Dec. 6, 2012

(51) Int. Cl.
*H01L 23/488* (2006.01)
*H05K 1/11* (2006.01)

(52) U.S. Cl.
USPC .................... 174/261; 257/738; 257/E23.023

(58) Field of Classification Search
CPC ............................... H05K 1/11; H01L 23/488
USPC .......................... 174/261; 257/738, E23.023
See application file for complete search history.

(56) References Cited

U.S. PATENT DOCUMENTS

| 5,468,995 | A | 11/1995 | Higgins, III |
| 6,818,090 | B2 | 11/2004 | Hacke et al. |
| 7,910,838 | B2 * | 3/2011 | Goodman ..................... 174/263 |
| 7,952,953 | B2 * | 5/2011 | Kuriyama ............... 365/230.06 |
| 2004/0041271 | A1 | 3/2004 | Storli |
| 2004/0145064 | A1 | 7/2004 | Kuramoto et al. |
| 2006/0006534 | A1 | 1/2006 | Yean et al. |
| 2007/0057372 | A1 | 3/2007 | Bauer et al. |
| 2009/0251874 | A1 | 10/2009 | Goodman |
| 2012/0306038 | A1 * | 12/2012 | Chow et al. ................... 257/434 |

OTHER PUBLICATIONS

Article by HDP User Group, "Polymer Ball Interconnect High Density Packaging User Group International, Inc" (c)2008 Pertinent citations contained in Detaailed Office Action.*
Article by HDP User Group, "Polymer Ball Interconnect Initiative," (c)2009 Pertinent citations contained in Detailed Office Action.*

* cited by examiner

*Primary Examiner* — Timothy Thompson
*Assistant Examiner* — Charles Pizzuto
(74) *Attorney, Agent, or Firm* — Vierra Magen Marcus LLP

(57) ABSTRACT

A system of micro balls is disclosed for coupling an electronic component to a printed circuit board. The micro balls have a small diameter, and each contact pad may include an array of two or more micro balls. An example of a micro ball may include a polymer core, surrounded by a copper layer, which is in turn surrounded by a layer of solder.

20 Claims, 3 Drawing Sheets

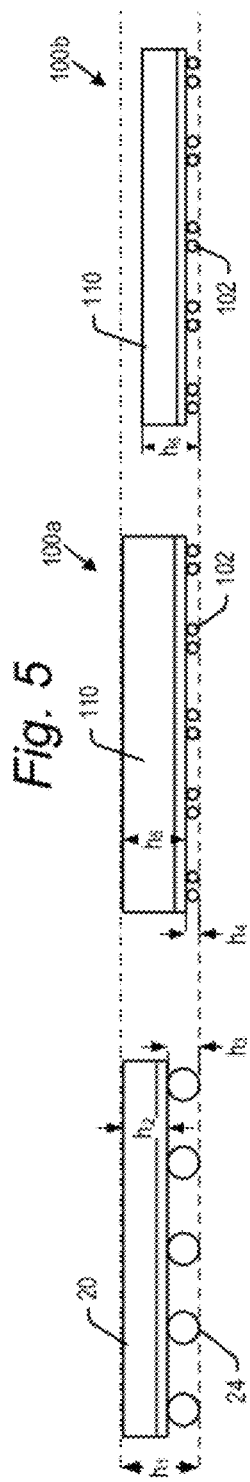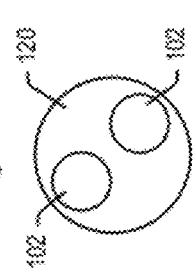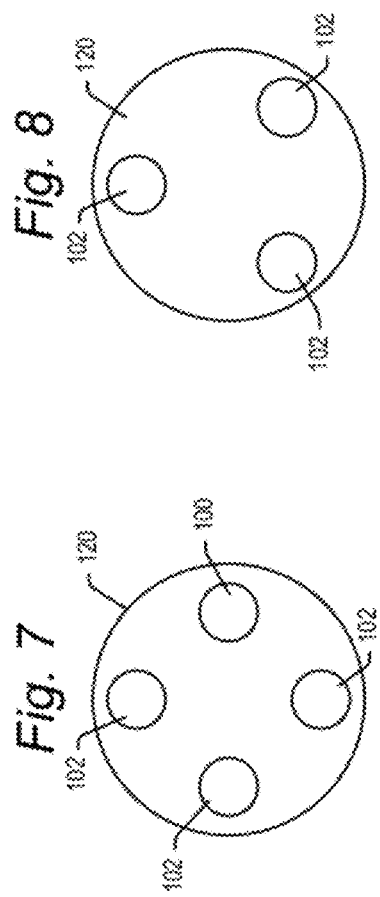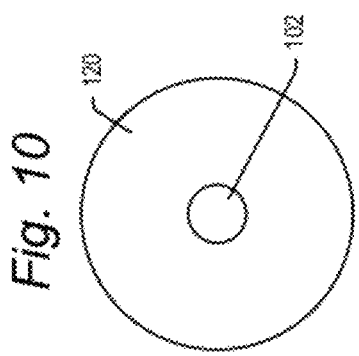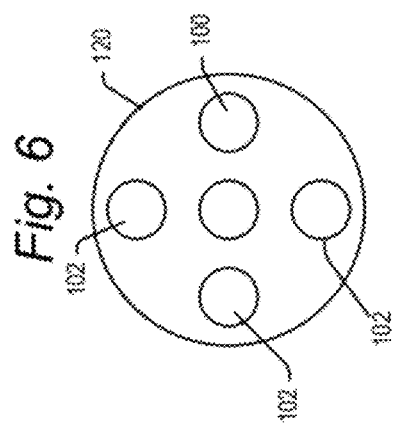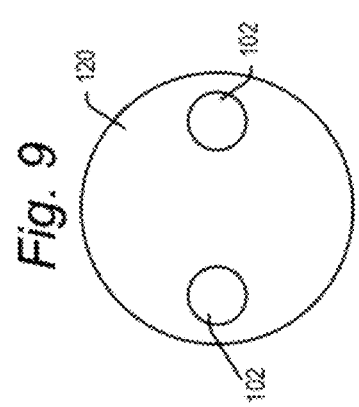

US 8,637,779 B2

ELECTRONIC COMPONENT INCLUDING MICRO BALLS

BACKGROUND

1. Field

The present technology relates to coupling an electronic component to a printed circuit board.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound to provide a protective package. SiP and MCM packages may be made as BGA (ball grid array) packages including solder balls affixed to contact pads on a lower surface of the die. These packages may alternatively be made as LGA (land grid array) packages, which have lands, or contact fingers, without solder balls on the lower surface.

Electronic components such as BGA and LGA packages may be surface mounted to a printed circuit board (PCB) as part of an electronic system. The solder ball array of the surface mounted electronic component may be placed on a portion of the PCB having a like configuration of contact pads, and then a reflow process may be performed to melt the solder balls and couple the surface mounted electronic component to the PCB.

FIG. 1 shows an example of a BGA package 20 mounted to a PCB 22 via an array of solder balls 24. The BGA package includes a substrate 26 and a protective mold cap 28 housing one or more semiconductor die. FIG. 2 is a bottom perspective view of the BGA package 20 including the array of solder balls 24. The size and configuration of solder balls is by example only, and it is understood that there may be a greater or lesser number of solder balls 24, and they may be in a variety of different configurations.

The diameter and height of solder balls 24 are important to the reliability and performance of the surface mounted electronic component. In general, it is desired to have a large diameter solder ball, providing a large stand-off between the surface mounted component and the PCB after reflow. This is so for at least two reasons. First, conventionally, larger solder balls are better able to absorb and withstand mechanical shock than smaller solder balls. Second, conventionally, larger solder balls are better able to absorb and withstand thermal stresses that are generated in solder balls due to the coefficient of thermal expansion (CTE) mismatch between the surface mounted electronic component and the PCB. Conventional solder balls may be about 0.3 mm in diameter. They may be generally spherical, and may flatten down to about 0.22 mm after they are reflowed.

While advantageous from a shock and CTE mismatch perspective, larger solder balls have the disadvantage of taking up valuable space along the height of an electronic component such as a BGA package. There is a drive to increase storage capacity and provide more semiconductor die in BGA and other flash memory packages. The height of such packages is often set by standards, and using an appreciable portion of that height for conventional solder balls reduces the space available for additional semiconductor die. It is known to surface mount LGA packages (having no solder balls), but underfill and/or mechanical adhesives are then required for shock and CTE mismatch which add to the cost and complexity of such designs.

DESCRIPTION OF THE DRAWINGS

FIG. 5 is a cross-sectional side view showing two configurations of electronic components including micro balls next to an electronic component including conventional solder balls.

FIGS. 6-11 illustrate different configurations of micro ball patterns on a contact pad of a surface mounted electronic component.

DETAILED DESCRIPTION

Embodiments will now be described with reference to FIGS. 3 through 11, which in general relate to micro balls for coupling an electronic component to a printed circuit board. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 3:
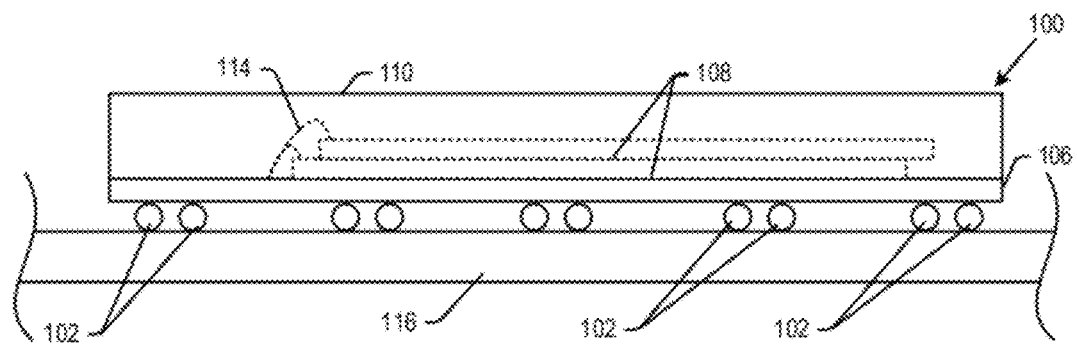
FIG. 3 is a cross-sectional side view of an electronic component including micro balls for surface mounting the component to a PCB according to embodiments of the present technology.
Figure 4:
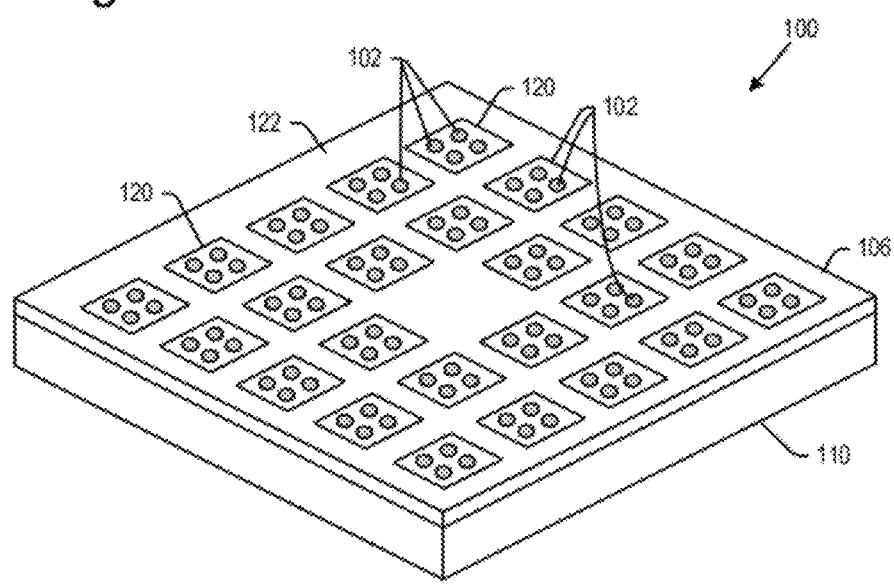
FIG. 4 is a bottom perspective view of a BGA package including micro balls according to embodiments of the present technology.

FIGS. 3 and 4 illustrate edge and bottom perspective views, respectively, of an electronic component 100 which may include micro balls 102 (some of which are numbered in the figures). The micro balls may be used to electrically couple and physically bond the electronic component 100 to a PCB 116 or other signal carrier medium. The electronic component 100 may be a BGA package, and the following description refers to BGA package 100 as an example of an electronic component 100. However, the electronic component 100 may be other surface mounted components which may be coupled to a printed circuit board or other signal carrier medium via micro balls according to the present technology.

In embodiments where the electronic component is a BGA package 100, the package 100 may in general include a substrate 106, one or more semiconductor die 108 and a mold cap 110 housing the one or more semiconductor die 108. The semiconductor die may for example be one or more flash memory chips or one or more flash memory chips and a controller die such as an ASIC. The substrate 106 may be a variety of chip carrier media, including a PCB, a leadframe or a tape automated bonded (TAB) tape. Where substrate 106 is a PCB, the substrate may be formed of a core having top and/or bottom conductive layers formed thereon. The core may be various dielectric materials such as for example, polyimide laminates, epoxy resins including FR4 and FR5, bismaleimide triazine (BT), and the like.

The conductive layers may be formed of copper or copper alloys, plated copper or plated copper alloys, Alloy 42 (42FE/58NI), copper plated steel or other metals or materials known for use on substrates. The conductive layers may be etched into a conductance pattern as is known for communicating signals between the semiconductor die and the PCB 116 to which the BGA package 100 is mounted as explained below.

Substrate 102 may include exposed metal portions forming contact pads on its top and bottom surface. On the top surface, the contact pads (not shown) may be used to receive wire bonds 114 to electrically couple the semiconductor die 108 to the substrate 106. On the bottom surface, contact pads 120 (some of which are numbered in FIG. 4) may be provided to receive micro balls 102 as explained below. The top and/or bottom surfaces of substrate 106 may receive a layer of solder mask 122, which leaves the contact pads on the respective surfaces exposed. The contact pads 120 on the bottom surface and/or the contact pads on the top surface may further be plated, for example in a known electroplating process.

The contact pads 120 exposed through the solder mask layer 122 on the bottom surface may be a variety of shapes, including for example square, rectangular, circular, oval or elliptical. In embodiments, the contact pads 120 may have a diameter of 300 μm, though the diameter may be larger or smaller than that in further embodiments. In one embodiment explained hereinafter, the diameter of the contact pads 120 may be reduced, for example to between 50 μm to 100 μm.

Each of the contact pads 120 on the bottom surface of the BGA package 100 may receive one or more micro balls 102. In the embodiment shown in FIG. 4, each contact pad 120 receives an array of four micro balls 102, though the configuration of the micro balls on each contact pad 120 may vary as explained below. In embodiments, the micro balls 102 may be balls of composite material, such as for example polymer-core balls available from Sekisui Chemical Co., Ltd., of Tokyo, Japan. In one example, such micro balls may include a polymer core of highly cross-linked divinyl-benzene (DVB). A coating of copper may be formed around the DVB core, followed by a coating of solder around the copper layer. It is understood that polymer-core micro balls 102 may have other configurations in further embodiments. In embodiments, the micro balls 102 may be spherical, but they may be cylindrical, cubic or other shapes in further embodiments.

In one example, each micro ball 102 may have a diameter of between 0.05 mm and 0.25 mm; in a further embodiment, each micro ball 102 may have a diameter between 0.5 mm and 0.15 mm; and in a further embodiment, each micro ball 102 may have a diameter of 0.1 mm. It is understood that the micro balls 102 may have diameters larger or smaller than these diameters in further embodiments. Given their small size, a number of such micro balls 102 may fit on a single contact pad 120, as shown for example in FIG. 4.

In embodiments, each contact pad 120 may have solder mask barriers which prevent the micro balls 102 from coalescing together. For example, in the embodiment of FIG. 4, each contact pad 120 could be broken into 4-quadrants by a solder mask dam, with the dam having a solder mask opening defined for each of the 4-quadrants. This solder mask dam will provide a barrier from the adjacent micro balls 102 on pad 120 joining together. It is understood that the use of a solder mask dam may be omitted on some or all of the contact pads 120 in further embodiments.

The use of an array of micro balls 102 on each contact pad 120 has various advantages relative to conventional solder balls. For example, while smaller than conventional solder balls, the micro balls perform well when subjected to jolts or mechanical shocks. This is in part due to the polymer core, which is better able to absorb shock than conventional solder balls. This is also due in part to the fact that, in embodiments, more than one such micro ball 102 is used on each contact pad 120. In such embodiments, the array of micro balls 102 on a given contact pad 120 adds structural support and planarity to the interface between the BGA package 100 and the PCB 116 on which the package 100 is mounted.

Another advantage to the micro balls 102 over conventional solder balls is that, although small, the micro balls are able to absorb and dissipate thermal stresses due to the CTE mismatch between the BGA package 100 and the PCB on which the package is mounted. This may in part be due to the copper layer included within each micro ball 102 in the embodiment of the present technology. The copper layer serves to transmit heat from the BGA package 100 to the PCB 116, or vice-versa, to reduce the CTE mismatch.

Figure 1:
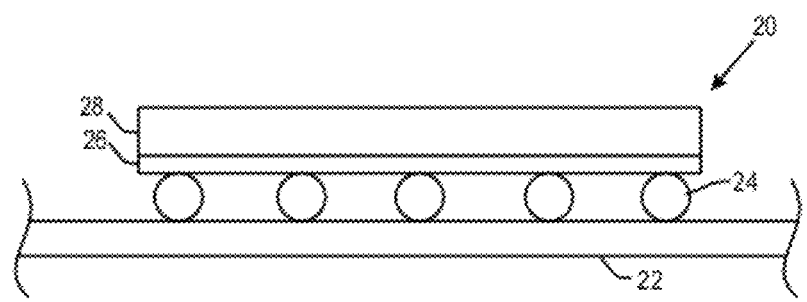
FIG. 1 is a prior art cross-sectional side view of an electronic component surface mounted on a PCB.
Figure 2:
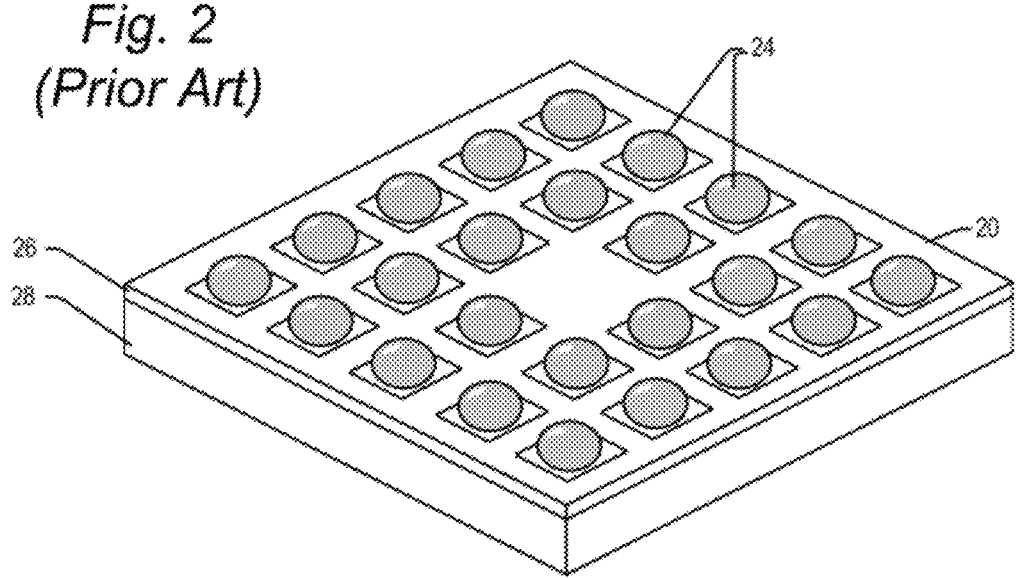
FIG. 2 is a prior art bottom perspective view of an example where the surface mounted electronic component is a BGA package.

As a further advantage relative to conventional solder balls, the micro balls allow the BGA package 100 to have a smaller stand-off from the PCB 116. FIG. 5 shows a conventional BGA package 20 including conventional solder balls 24 as in prior art FIG. 1. The overall height of the package, $h_1$, may for example be 1.2 mm. The height of the package may be comprised of the mold cap and substrate thickness, $h_2$, plus the height of the solder balls, $h_3$. In embodiments, $h_2$ may be 0.98 mm and the thickness of the solder balls (after reflow) may be 0.22 mm.

The small size of the micro balls 102 provides greater flexibility in the design of the electronic component. In one option, an electronic component 100a shown in FIG. 5 may have the same overall height, $h_1$, as conventional package 20. The substrate 106 may be the same thickness as in conventional package 20, but as the micro balls 102 have a smaller diameter, the mold cap 110 may have a larger height. For example, $h_4$ may be 0.02 mm (after reflow as explained below). Thus, the thickness of the mold cap and substrate may for example be 1.18 mm. This additional thickness may be taken up by a thicker mold cap 110. As such, for semiconductor die of a given thickness, the BGA package 100a may include more die than the conventional package 20.

A further example is shown in FIG. 5 by electronic component 100b. Here, the mold cap and substrate may be the same thickness as in conventional package 20. In such embodiments, the overall thickness, $h_6$, of the package 100b may be smaller than the thickness $h_1$ of conventional package 20.

As noted above, the micro balls 102 may be provided in different configurations on a contact pad 120. FIGS. 6 through 11 show an exposed contact pad 120 (circular in these examples) including different configurations of micro balls 102. The different configurations of FIGS. 6-9 each show an array of micro balls 102 on a contact pad, where the number of micro balls in an array varies between 2 and 5 in the respective figures. In an embodiment shown in FIG. 10, there may be a single micro ball 102 on the pad 120. It is understood that the micro balls 102 may be provided in a variety of other configurations in further embodiments, and there may be more than 5 micro balls on a contact pad 120 in further embodiments.

In FIGS. 6-10, the contact pad 120 may be of a conventional size, such as for example 300 μm. However, in the embodiment of FIG. 11, the contact pad 120 may be made small, given the small size of the micro balls 102. In embodiments, the contact pad of FIG. 11 may be between 50 μm and 100 μm, though it may be larger or smaller than this range in further embodiments. The embodiment of FIG. 11 is shown with two micro balls 102. Further embodiments may include differing numbers of micro balls 102 and in different configurations on the smaller contact pad of FIG. 11. One advantage of providing smaller contact pads on the BGA package 100 is that it provides greater flexibility and freedom with respect to the routing of electrical traces around the contact pads 120.

With regard to assembly of an electronic system including the electronic component 100 and the PCB 116, the micro balls 102 may be affixed to the contact pads 120 via a b-stage flux or a layer of solder applied to the contact pads 120. Thereafter, the micro balls 102 may be tacked onto the layer of flux or melted onto the layer of solder to affix the micro balls 102 to the substrate 106.

Next, the electronic component 100 may be positioned against the PCB 116. The PCB 116 may include a pattern of contact pads matching the pattern of contact pads 120 and micro balls 102. Thus, each micro ball 102 lies against a contact pad 120 of the component 100 on one side of the micro ball, and against the contact pad on PCB 116 on an opposite side of the micro ball. The contact pads on the PCB 116 may be formed in the same manner and configuration as the contact pads 120 on the substrate 106. After the electronic component 100 is positioned on the PCB 116, the electronic component and PCB may be put through a reflow process to melt portions of the micro balls onto the substrate and PCB contact pads to electrically and physically couple the electronic component 100 to the PCB 116. The reflow process may be a heating process for example at 220° C. over a period of for example 60 seconds. The temperature and duration of the reflow process may vary in further embodiments. In an alternative embodiment, the reflow process may be an ultrasonic welding process.

It is a further advantage of the present system that it may be used with standard size contact pads on the PCB 116. Even though small micro balls 102 are used, as a single contact pad may include a number of micro balls, the standard size PCB contact pad may be used. It is understood that, in further embodiments, the size of the PCB contact pad used may be smaller than a standard sized pad. For example, where a smaller substrate contact pad 120 is used, a smaller PCB contact pad may be used. A smaller PCB contact pad may be used even where a standard sized substrate contact pad 120 is used.

Once the electronic system is formed, it may be tested. Such testing includes a drop test, where the system is subjected to repeated mechanical shocks to see whether the micro ball bonds are able to withstand the mechanical shocks. The testing may further include temperature cycling where the electronic system is cooled, for example to 0° C., and then heated, for example to 100° C., in repeated cycles to see whether the micro ball bonds are able to withstand the temperature cycling. The hot and cold temperatures in the temperature cycling test may vary from those values set forth above. A further test which may be conducted is a temperature shock test, which is similar in operation and purpose to the temperature cycling test, but the temperature changes are abrupt. As noted above, despite the low stand-off provided by the micro balls 102, an electronic component 100 affixed to a PCB 116 via micro balls 102 is able to perform the above-described test nearly as well, as well, or better than a system assembled using conventional solder balls.

In summary, an embodiment of the present technology includes an electronic component, comprising: a substrate including one or more contact pads; and a plurality of balls of composite material, on one contact pad of the one or more contact pads, for physically and electrically coupling the electronic component to a printed circuit board.

In another example, the present technology includes a ball grid array package, comprising: a substrate including one or more contact pads; and a plurality of micro balls on one contact pad of the one or more contact pads for physically and electrically coupling the ball grid array package to a printed circuit board, the plurality of micro balls each having a diameter between 0.05 and 0.25 mm.

In a further example, the present technology includes an electronic system, comprising: a printed circuit board; and a ball grid array package, including: a substrate including one or more contact pads; and a plurality of micro balls on one contact pad of the one or more contact pads for physically and electrically coupling the ball grid array package to a printed circuit board.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An electronic component, comprising:
    a substrate including one or more contact pads; and
    a plurality of balls of composite material, arranged in a non-linear grouping on one contact pad of the one or more contact pads, for physically and electrically coupling the electronic component to a printed circuit board, the plurality of balls remaining separate from each other on the one contact pad after reflow.

2. The electronic component of claim 1, wherein the plurality of balls of composite material each comprises a core formed of a polymer.

3. The electronic component of claim 2, wherein the plurality of balls of composite material each comprises a copper layer formed around the polymer core.

4. The electronic component of claim 3, wherein the plurality of balls of composite material each comprises a layer of solder around the copper layer.

5. The electronic component of claim 1, wherein the plurality of balls of composite material comprises two balls of composite material.

6. The electronic component of claim 1, wherein the plurality of balls of composite material comprises three balls of composite material.

7. The electronic component of claim 1, wherein the plurality of balls of composite material comprises four balls of composite material.

8. The electronic component of claim 1, wherein the plurality of balls of composite material comprises five balls of composite material.

9. The electronic component of claim 1, wherein the electronic component is flash memory semiconductor package.

10. The electronic component of claim 1, wherein the electronic component is a BGA package.

11. A ball grid array package, comprising:
a substrate including one or more contact pads; and
a plurality of micro balls arranged in a non-linear grouping on one contact pad of the one or more contact pads for physically and electrically coupling the ball grid array package to a printed circuit board, wherein the micro balls are separate from each other before and after reflow.

12. The ball grid array package of claim 11, wherein the plurality of micro balls each has a diameter between 0.05 and 0.25 mm.

13. The ball grid array package of claim 11, wherein the plurality of micro balls each has a diameter between 0.05 and 0.15 mm.

14. The ball grid array package of claim 11, wherein the plurality of micro balls each comprises a polymer core solder ball.

15. The ball grid array package of claim 11, wherein the plurality of micro balls comprises two to five balls of composite material.

16. An electronic system, comprising:
a printed circuit board; and
a ball grid array package, including:
a substrate including one or more contact pads; and
a plurality of reflowed micro balls arranged in a non-linear grouping on one contact pad of the one or more contact pads physically and electrically coupling the ball grid array package to a printed circuit board.

17. The electronic system of claim 16, the plurality of micro balls each having a diameter between 0.05 and 0.25 mm before coupling to the printed circuit board.

18. The electronic system of claim 16, the plurality of micro balls each having a diameter of 0.1 mm before coupling to the printed circuit board.

19. The electronic system of claim 16, the plurality of micro balls each having a diameter of 0.02 mm after a coupling to the printed circuit board.

20. The electronic system of claim 16, three or more micro balls of the plurality of micro balls defining a plane, the printed circuit board coupled to the plane defined by the three or more micro balls.

* * * * *